United States Patent [19]

Maimone et al.

[11] Patent Number: 4,800,340
[45] Date of Patent: Jan. 24, 1989

[54] METHOD AND APPARATUS FOR GENERATING A DATA RECOVERY WINDOW

[75] Inventors: Peter Maimone, Irvine; Richard G. Yamasaki, Torrance, both of Calif.

[73] Assignee: Silicon System, Ins., Tustin, Calif.

[21] Appl. No.: 41,728

[22] Filed: Apr. 22, 1987

[51] Int. Cl.[4] .............................................. H03L 7/00
[52] U.S. Cl. .................................. 331/1 A; 331/113 R; 328/72
[58] Field of Search .................... 331/10, 16, 111, 143, 331/153, 172, 177 R, 177 V, 113 R; 307/480, 527, 529; 328/72, 73, 74, 75, 133; 375/106, 118, 119, 120; 358/17, 148, 150; 360/51; 364/67, 176

[56] References Cited

U.S. PATENT DOCUMENTS 4,151,485  4/1979  LaFratta ........................... 375/108 X
4,633,488  12/1986  Shaw .............................. 331/1 A X Primary Examiner—Eugene R. LaRoche
Assistant Examiner—Robert J. Pascal
Attorney, Agent, or Firm—Hecker & Harriman

[57] ABSTRACT

Method and apparatus for generating a decode window. A phase locked loop locks a pulse edge of a delayed read data (DRD) signal to an edge of a voltage control oscillator (VCO) clock signal. The edges of the decode window are generated directly from the outer edges of the VCO clock signal. This eliminates errors introduced by quarter cell delay lines, particularly in integrated circuit applications. The transition of the VCO clock signal is used to define a nominal center position coinciding with the mean center position of a data stream. Differential control signals are utilized to shift the VCO transition so that it may be synchronized with the mean bit center position and compensate for non-symmetrical peak jitter. The VCO transition may be shifted without changing the period of the VCO clock signal.

19 Claims, 3 Drawing Sheets

METHOD AND APPARATUS FOR GENERATING A DATA RECOVERY WINDOW

BACKGROUND OF THE INVENTION

1. Field of the Invention

This invention relates to the field of data synchronizers in general and circuitry for adjusting data synchronizer windows in particular.

2. Background Art

Information is often transmitted or exchanged in bit stream format. A bit stream consists of a series of logical "1's" or "0's" presented in serial fashion. To accurately decode a serial bit stream, bit frames or bit windows must be accurately defined. A one to one correspondence exists between each bit and each frame or window. If the window is too large, more than one bit of information may be contained within the window and one or all bits may be lost. If the bit window is too small, no detectable information will result. Further, loss of bit information at point locations may lead to error propogation throughout the decoding process.

For a variety of reasons, data bit streams may include a degree of "jitter" which tends to force a data bit near a bit window boundary. To maximize the efficiency of the data recovery system, it is desired to provide an accurately centered decode window as large as the theoretical window for the given data rate. To accomplish this in the prior art, the average or mean center bit position is established or estimated. A decode window is then defined having a nominal center coinciding with the mean center bit position of the data stream. However, such prior art schemes have disadvantages. For instance, if the mean bit position of the data does not coincide with the nominal center of the decode window, the jitter may extend over one or the other window edge. Further, if the peak jitter about the mean center is not symmetrical, data may occur outside of the decode window.

A second disadvantage of prior art schemes is a difficulty in defining a decode window in integrated circuit and monolithlic applications. Prior art systems utilize phase locking to generate one edge of a data window and utilize a quarter cell delay line to generate the other edge. However, in integrated circuit applications, quarter cell delay lines are subject to large process variations. As a result, the decode window accuracy is compromised.

It is desired to establish a decode window around the expected time position of bits within a data stream so that any bit that occurs within a given window is captured. Therefore, it is an object of the present invention to provide a data synchronizer which accurately centers bit windows around a mean center position of a bit.

It is a further object of the present invention to provide a data synchronizer which allows a data window to be shifted to compensate for unequal jitter about the nominal center.

It is yet another object of the present invention to provide a data synchronizer which may be implemented in an integrated circuit independent of delay line accuracy.

SUMMARY OF THE PRESENT INVENTION

A data synchronizer is provided to establish a decode window around the mean center position of bits within a data stream. Any bit occuring within a given decode window is captured and assumed to occur at the window center. A phase locked loop including a voltage controlled oscillator clock (VCO) is used to generate a decode window. The rising edge of the VCO clock window is locked to the rising edge of a delayed read data (DRD) signal. The edges of the decode window are defined by the falling edges of the VCO clock. By phase locking one edge of the decode window to the data stream, and developing the other edge off a VCO clock, the present invention is not dependent on quarter cell delay line accuracy. As a result, the present invention has particular use in integrated circuits and monolithic applications. By changing the duty cycle of the VCO clock, the nominal center of the decode window may be shifted towards either edge of the decode window without effecting the period of the decode window. Differential digital logic is utilized so that the effect of output voltage rise and fall time differences are cancelled.

DETAILED DESCRIPTION OF THE PRESENT INVENTION

A data synchronizer for establishing a decode window around the expected time position of bits within a data stream is described. In the following description, numerous specific details, such as edge locations, signal levels, etc., are described to provide a more thorough description of the present invention. It will be obvious, however, to one skilled in the art, that the present invention may be practiced without these specific details. In other instances, well known features have not been described in detail in order not to unnecessarily obscure the present invention.

Figure 1:
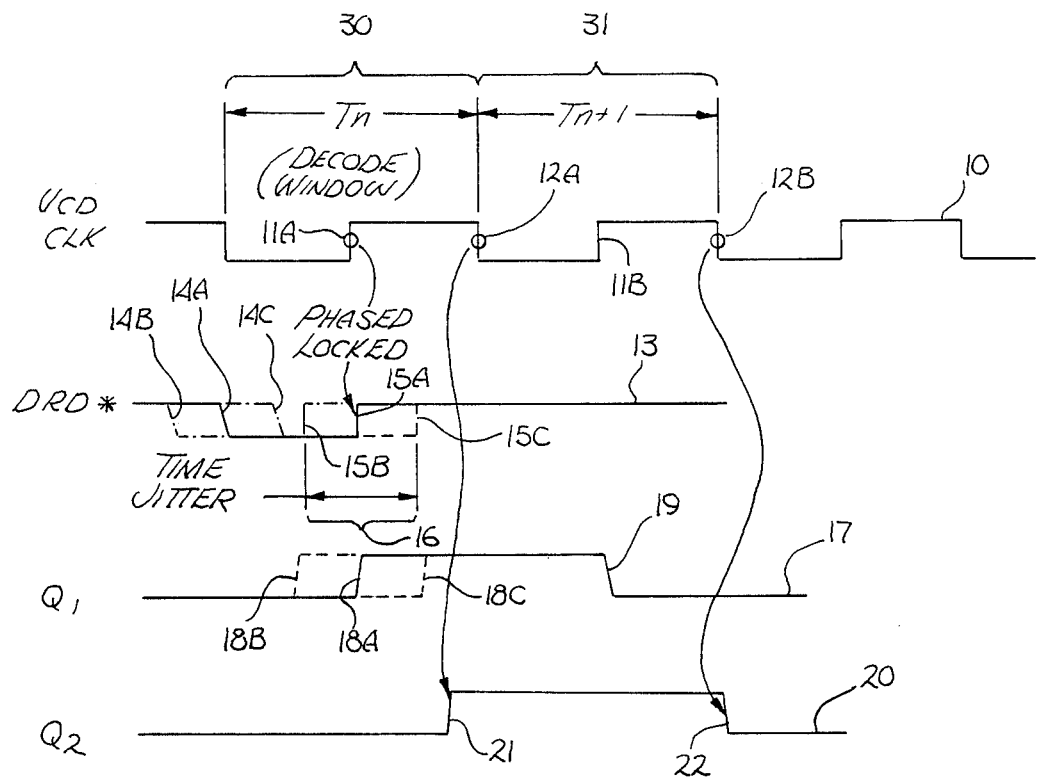
FIG. 1 is a timing diagram illustrating voltage wave forms of the present invention.

Referring to FIG. 1, timing diagrams for various signals utilized in the present invention are shown. A voltage controlled oscillator (VCO) clock 10 is utilized to generate decode windows. A decode window, such as decode window 30, is defined in the preferred embodiment by consecutive falling edges of VCO clock 10. Window 30 defines a decode window Tn and ends at falling edge 12A of VCO clock 10. The next window 31 defines decode window Tn+1 and extends from falling edge 12A to falling edge 12B of the VCO clock 10.

A delayed read data (DRD) line 13 is also shown in FIG. 1. DRD 13 is a quarter cell wide pulse whose leading edge is defined by the leading edge of the complement of data pulses in the data stream. As can be seen, the falling and rising edges 14A and 15A (mean center) of DRD 13 may "jitter" as a result of the data jitter. In other words, the data transition point may be shifted ahead in time so as to be defined by falling and rising edge 14B and 15B or shifted back in time so as to be defined by falling and rising edge 14C and 15C. The width of maximum jitter around any mean center point 15A is shown by line 16. Although the peak jitter (edges 15B and 15C) is shown to be symmetrical about the mean center (edge 15A), such is not always the case. For example, peak jitter may be greater to the left of mean center 15A than to the right. It is desired to balance the maximum allowable jitter with the ability of the present invention to accurately center a decode window around a nominal bit position.

In the preferred embodiment of the present invention, the nominal center of a decode window is the rising edge of VCO clock 10 such as rising edge 11A. Thus, it is desired to synchronize rising edge 11A with mean center 15A of DRD 13 in a phase locked manner.

Figure 2:
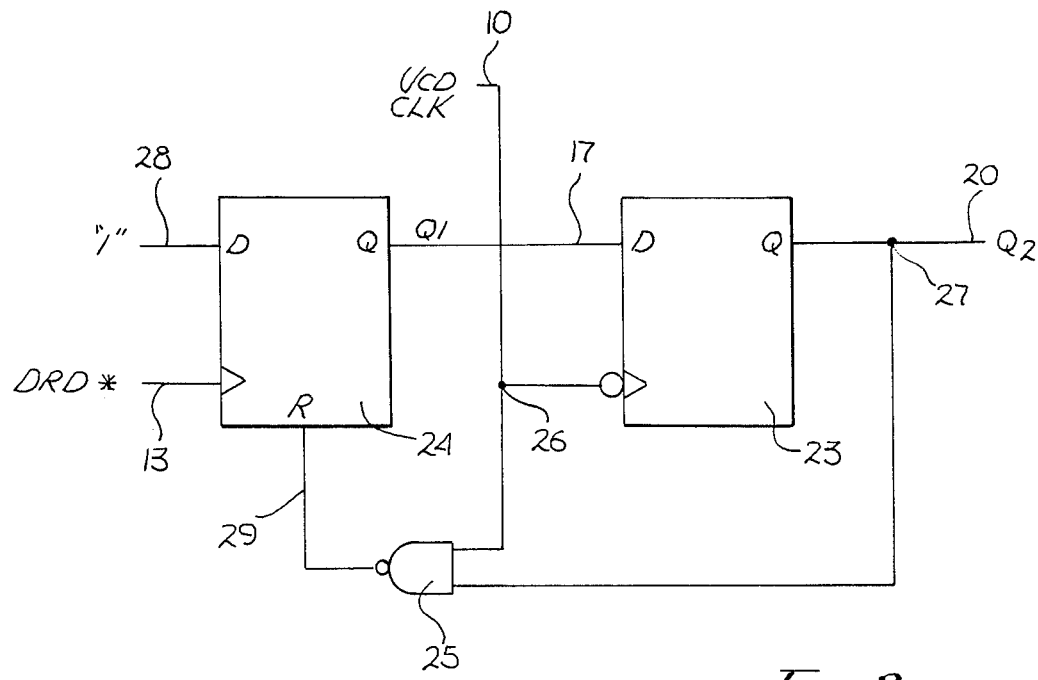
FIG. 2 is a circuit diagram illustrating a voltage control oscillator clock signal generator of the present invention.

The data synchronizing circuitry is illustrated in FIG. 2. DRD 13 is coupled to the clock input of flip-flop 24. The data input 28 of flip-flop 24 is held high. The Q output 17 of flip-flop 24 is coupled to the data input of flip-flop 23. Flip-flop 23 is clocked through node 26 by VCO clock signal 10. The Q output 20 of flip-flop 23 at node 27 is coupled in a feedback manner to AND gate 25. AND gate 25 is also coupled to node 26 (VCO clock signal 10). The output 29 of AND gate 25 is coupled to the reset input of flip-flop 24.

Referring to FIGS. 1 and 2, we see that a rising edge on the DRD 13 causes the output 17 of flip-flop 24 to go high. This is illustrated in FIG. 1 by rising edge 18A of output 17. A falling edge of VCO clock 10 triggers flip-flop 23, causing output 20 to go high as shown at rising edge 21 of output 20 of FIG. 1. As VCO clock signal 10 goes high (such as at rising edge 11B), the output of AND gate 25 goes high and resets flip-flop 24, pulling output 17 low as shown by falling edge 19. Falling edge 12B of VCO clock signal 10 then triggers flip-flop 23, causing output 20 to go low as shown at falling edge 22.

Regardless of where DRD 13 goes high in decode window 30, this rising edge is displaced to the falling edge of VCO clock 10 at window 31 by the phase locking circuitry. The other edge of the decode window is generated directly off the VCO clock signal. Unlike prior art devices, the present invention is not dependent on the accuracy of the quarter cell delay line DRD 13 to define a decode window. Thus, the output pulse 20 is centered around the rising edge 11B of VCO clock 10 and occurs in time window 31. The VCO clock signal is a symmetrical clock signal running at twice the data bit cell rate in the preferred embodiment of the present invention.

If the peak jitter is not symmetrical about the mean center position, it is desired to shift the nominal center of the decode window to assure bit capture. In other instances, (e.g. testing purposes), it may be desired to shift the nominal center position left or right as desired. However, the period of the decode window should remain constant.

As described above, the centering of the data window of the present invention depends on the symmetry of VCO clock period. Shifting the duty cycle of the VCO clock 10 effectively shifts the relative position of the DRD pulse within the decode window. The window shifting capability facilitates automatic calibration, window margin testing, error recovery, and systematic error cancellation.

Figure 3:
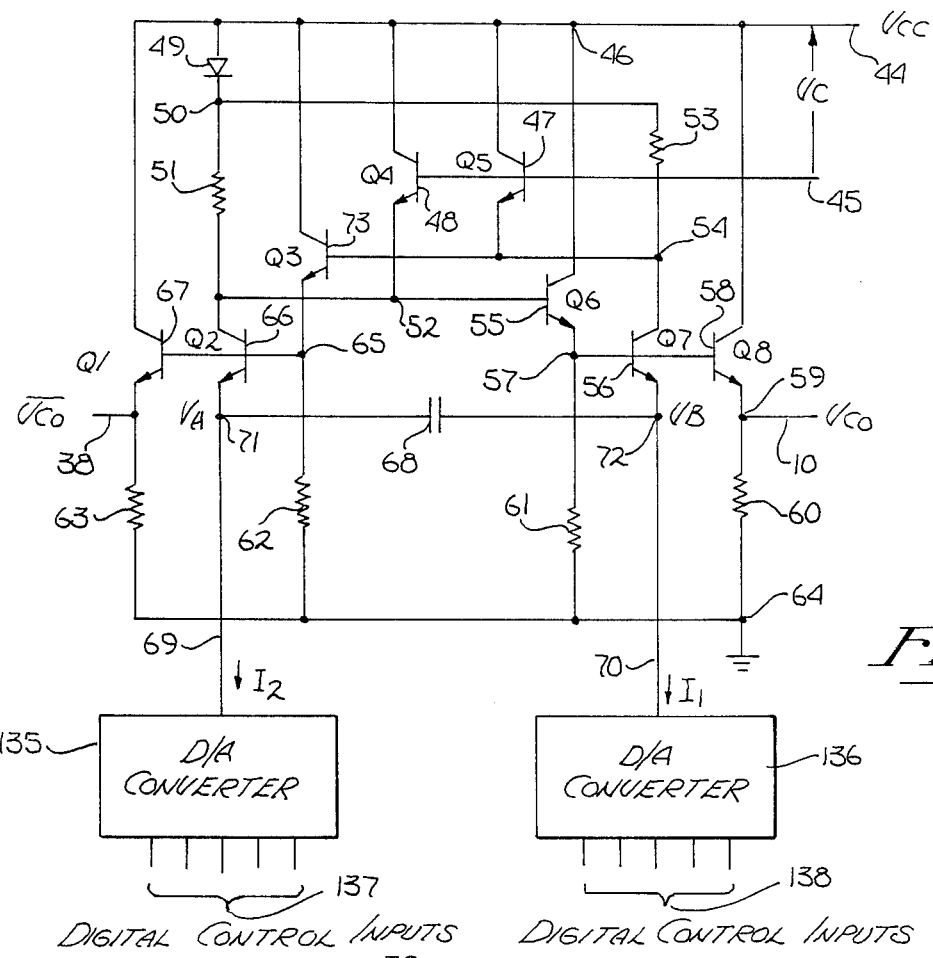
FIG. 3 is a circuit diagram illustrating the window shifting circuitry of the present invention.

The window shifting circuitry is illustrated in FIG. 3. A plurality of emitter coupled transistors are utilized to form a voltage controlled oscillator (VCO). Supply voltage VCC 44 is coupled to the collectors of transistors 58, 55, 47, 48, 73 and 67. VCC 44 is coupled through diode 49 to node 50 and node 50 is coupled through resistor 51 to node 52 (the collector of transistor 66). Node 50 is also coupled through resistor 53 to node 54 (the collector of transistor 56). Transistors 47 and 48 are base coupled to voltage VC 45.

The emitter of transistor 48 and base of transistor 55 are coupled to node 52. The emitter of transistor 47 and base of transistor 73 are coupled to node 54. The emitter of transistor 73 is base coupled to transistor 66 and 67 at node 65. The emitter of transistor 55 is base coupled to transistors 56 and 58 at node 57. Node 65 is coupled through resistor 62 to ground at node 64. Node 57 is coupled through resistor 61 to ground.

The emitter of transistors 58 and 67 are coupled to ground at node 64 through resistors 60 and 63 respectively. A capacitor 68 is coupled to the emitters of transistors 66 and 56 at nodes 71 and 72 respectively. Node 71 is coupled to D/A converter 135 and represents a current I69. Node 72 is coupled to D/A converter 136 and represents current I70. A VCO signal 10 is taken at node 59 from the emitter of transistor 58. The complement of $\overline{VCO}$ clock signal 10, VCO 38, is taken from the emitter of transistor 67. Node 71 represents a voltage VA and node 72 represents a voltage VB.

Figure 4:
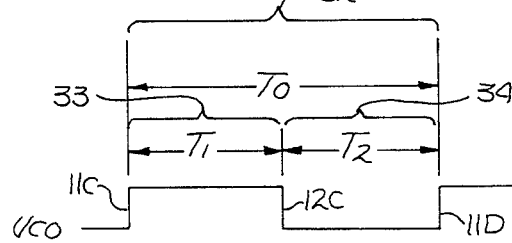
FIG. 4 is a timing diagram illustrating the relationships among a plurality of signals.

VA and VB are timing voltage wave forms and are illustrated in FIG. 4. VA and VB are identical with VA being shifted one half clock period from VB. The VCO clock signal 10 has a period 32 defined by consecutive rising edges 11C and 11D. This clock period 32 is comprised of segment 33 from rising edge 11C to falling edge 12C and segment 34 from falling edge 12C to rising edge 11D. Segment 33 is inversely proportional to I70 while segment 34 is inversely proportional to current I69. Referring briefly to FIG. 3, we see that currents I69 and I70 are controlled by digital control inputs 137 and 138 respectively inputted to D/A converters 135 and 136 respectively. In this manner, if segment 33 is increased (current I70 is decreased), current I69 can be increased so that segment 34 is decreased. The same clock period 32 can then be maintained while fine tuning the adjustment of period segments 33 and 34.

Referring to FIGS. 1 and 4, if the data jitter is such that the peak jitter of the data is shifted to the left of nominal center position 14A and 15A, the window shifting circuitry is utilized to lengthen period segment 33 and shorten period segment 34. If the peak jitter shifts the mean center to the right of nominal position 14A and 15A, the window shifting circuitry is utilized to shorten period segment 33 and lengthen period segment 34.

Typically, error correction codes are inserted in the serial data stream to test for accuracy. The output of flip-flop 23 is monitored and if an error in the error correction code is detected, a microprocessor inputs digital control inputs 137 and 138 to D/A converters 135 and 136 respectively so that the window shifting circuitry may be utilized to reposition the nominal center of the decode window.

Figure 5:
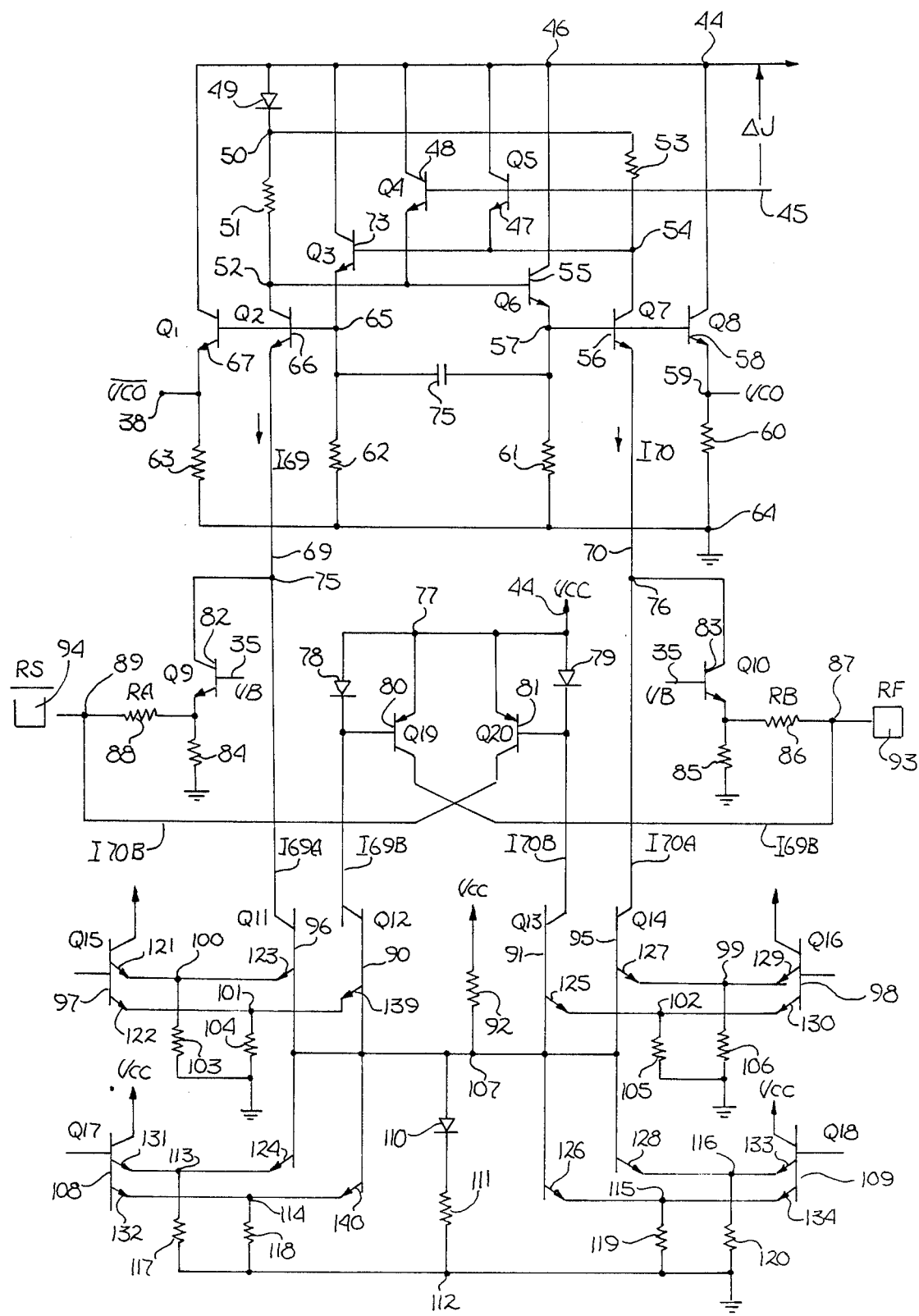
FIG. 5 is a circuit diagram illustrating an alternate embodiment of the present invention.

Alternate window shifting circuitry is illustrated in figure 5. The voltage control oscillator is generally as described in FIG. 3 with the exception that capacitor 75 is coupled to the emitters of transistors 73 and 55 at nodes 65 and 57 respectively. (Capacitor 68 coupled to the emitters of transistors 66 and 56 is eliminated.) Alternate circuitry is provided for adjusting currents I69 and I70.

In the alternate embodiment illustrated in FIG. 5, current I69 is taken from node 75 and current I70 is taken from node 76. Node 75 is coupled to the collector of transistor 82. The base of transistor 82 is VB timing voltage signal 35. The emitter of transistor 82 is coupled through resistor 84 to ground and through resistor 88 to node 89. Node 89 is coupled to input pad 94.

Node 76 is coupled to the collector of transistor 83. The base of transistor 83 is VB timing voltage 35. The emitter of transistor 83 is coupled through resistor 85 to ground and through resistor 86 to node 87. Node 87 is coupled to RF pad 93.

Supply voltage VCC 44 is coupled through node 77 to the emitters of transistors 80 and 81. The collectors of transistors 80 and 81 are coupled to nodes 87 and 89 respectively. Node 77 (VCC 44) is also coupled through diodes 78 and 79 to the base of transistors 80 and 81 respectively. The base of transistor 80 is coupled to the collector of transistor 90. Emitter 139 of transistor 90 is coupled to node 101. Node 101 is coupled to emitter 122 of transistor 97. Node 101 is also coupled through resistor 104 to ground.

Emitter 139 of transistor 90 is coupled to node 114. Node 114 is coupled to emitter 132 of transistor 108 and through resistor 118 to ground at node 112. Node 75 is coupled to the collector of transistor 96. Emitter 123 of transistor 96 is coupled to node 100. Node 100 is coupled to emitter 121 of transistor 97. The collector of transistor 97 is coupled to voltage VCC. Node 100 is coupled through resistor 103 to ground.

Emitter 124 of transistor 96 is coupled to node 113. Node 113 is coupled to emitter 131 of transistor 108. The collector of transistor 108 is coupled to voltage VCC. Node 113 is coupled through resistor 117 to ground at node 112.

The base of transistor 81 is coupled to the collector of transistor 91. Emitter 125 of transistor 91 is coupled to node 102. Node 102 is coupled to emitter 130 of transistor 98 and through resistor 105 to ground. Emitter 126 of transistor 91 is coupled to node 115. Node 115 is coupled to emitter 134 of transistor 109 and through resistor 119 to ground at node 112.

Node 76 is coupled to the collector of transistor 95. Emitter 127 of transistor 95 is coupled to node 99. Node 99 is coupled to emitter 129 of transistor 98 and through resistor 106 to ground. The collector of transistor 98 is coupled to voltage VCC. Emitter 128 of transistor 95 is coupled to node 116. Node 116 is coupled to emitter 133 of transistor 109 and through resistor 120 to ground at node 112. The collector of transistor 109 is coupled to voltage VCC. The base of transistors 96, 90, 91 and 95 are coupled to node 107. Node 107 is coupled through resistor 92 to supply voltage VCC and through diode 110 and resistor 111 to ground at node 112.

Transistors 82 and 83 are current mirrors which form the major source of current I69 and I70 at nodes 75 and 76 respectively. Output pads RS94 and RF93 may be connected through external resistors to ground so that small systematic errors can be cancelled. Output pads RS94 and RS93 also provide means of determining the state of the window shifting circuitry.

If the base voltage of outer transistors 97, 98, 108 and 109 are higher than the base voltages of inner transistors 96, 90, 91 and 95, the inner transistors are off and no window shifting occurs. If transistor 98's base voltage is lower than the base voltage of transistors 91 and 95, transistors 91 and 95 turn on and produce currents I70B and I70A. Current I70A adds directly to current I70 at node 76. Current I70B is mirrored at transistor 81 and coupled to node 89. This current I70B at node 89 effectively subtracts from current I69 at node 75. This is accomplished by reducing the current in transistor 82. Current I70B from node 89 flows through resistor 88, producing a voltage change at RS94 which can be detected.

If the base voltage of transistor 97 is lower than the base voltage of transistors 96 and 90, transistors 96 and 90 produce currents I69A and I69B respectively. Current I69A adds to current I69 at node 75. Current I69B is mirrored by transistor 80 and reduces current I70 at node 76 by acting through transistor 83. Current I69B, coupled to node 87, causes a voltage drop across resistor 86 which may be detected at output pad RF93.

Transistors 108 and 109, acting in conjunction with inner transistors 96, 90, 91 and 95, allow different magitudes of window shift. Of course, if desired, any number of levels of magitude control could be utilized without departing from the scope or spirit of the present invention.

The base voltages of transistors 97, 99, 108 and 109 are set by digital logic such as from a microprocessor. As with the embodiment of FIG. 3, the data is tracked for accuracy of error code inserts and the decode window is shifted left or right accordingly by manipulating the base voltages on transistors 97 and 98. The magnitude of such window shifts is controlled by the base voltages of transistors 108 and 109.

The window shifting circuitry of the present invention results in a programmable decode window. As previously discussed, prior art decoders set a nominal center based on an assumption of symmetrical jitter in the data stream. In the present invention, however, the mean center of the jitter of the data stream is determined and the nominal center of the decode window is shifted to coincide with peak jitter shifts. In this manner, serial data may be accurately decoded.

We claim:

1. A circuit for providing a programmable decode window generator comprising:
   clock generating means for generating a first clock signal having a period and having a first transition point in said period of said first clock signal;
   data synchronizing means coupled to a delayed read data (DRD) signal and said first clock signal, said DRD having a mean center position, said data synchronizing means for locking said DRD signal to said first clock signal;
   programming means coupled to said clock generating means for shifting said first transition point to coincide with said mean center position without altering said period of said first clock signal.

2. The circuit of claim 1 wherein said clock generating means comprises a voltage controlled oscillator (VCO).

3. The circuit of claim 1 wherein said data synchronizing means comprises first and second flip-flops wherein the output of said second flip-flop is coupled in a feedback loop to the reset input of said first flip-flop.

4. The circuit of claim 3 wherein said programming means comprises first and second control signals coupled to said VCO, said first and second control signals for controlling the position of said first transition point without altering said period of said first clock signal.

5. A circuit for providing a decode window comprising:
   clock generating means for generating a first clock signal having rising and falling edges, said first clock signal having a period defined by consecutive falling edges;

data synchronizing means coupled to said first clock signal and to a delayed read data (DRD) signal, said data synchronizing means for detecting a rising edge of said DRD signal and each of said falling edges of said first clock signal, said data synchronizing means outputting said decode window wherein said decode window has a rising edge locked to said falling edge of said first clock signal;

window shifting means coupled to said first clock generating means for shifting said rising edge of said first clock signal without altering said period of said first clock signal.

6. The circuit of claim 5 wherein said clock generating means comprises a voltage controlled oscillator (VCO).

7. The circuit of claim 6 wherein said data synchronizing means comprises first and second flip-flops, said second flip-flop having an output coupled to a reset of said first flip-flop.

8. The circuit of claim 7 wherein said window shifting means comprises first and second control signals coupled to said VCO for shifting said rising edge of said first clock signal.

9. A circuit for providing a decode window having at least first and second edges comprising:

clock generating means for generating a first clock signal, said first clock signal having a period comprising a first segment and a second segment separated at a transition point, said first clock signal having at least third and fourth edges;

data synchronizing means coupled to said first clock signal and to a delayed read data (DRD) signal, said DRD signal having a mean center position and at least fifth and sixth edges, said loop synchronizing means outputting said decode window and locking said first edge of said decode window to said fifth edge of said DRD signal, said data synchronizing means locking said second edge of said decode window to said fourth edge of said first clock signal;

shifting means coupled to said clock generating means and said DRD signal, said shifting means for shifting said transition point to be synchronous with said mean center position.

10. The circuit of claim 9 wherein said clock generating means comprises a voltage control oscillator (VCO).

11. The circuit of claim 10 wherein said period of said clock generating means is approximately twice that of said decode window.

12. The circuit of claim 10 wherein said data synchronizing means is comprised of first and second flip-flops, said first flip-flop having a first data input coupled to a logical one, said first flip-flop having a first clock input coupled to said DRD signal, said second flip-flop having an input coupled to an output of said first flip-flop, said second flip-flop having a clock input coupled to a said first clock signal, said second flip-flop having an output outputting said decode window, said second flip-flop output coupled to a first logic gate, said first clock signal coupled to said first logic gate, said logic gate having a first output coupled to a reset input of said first flip-flop.

13. The circuit of claim 12 wherein said shifting means comprises first and second control signals coupled to said VCO, said first control signal for altering the length of said first segment and said second control signal for altering the length of said second segment, said shifting means such that said period of said first clock signal remains constant.

14. A method of providing an accurate decode window having a constant period comprising the steps of:

providing a voltage control oscillator (VCO) outputting a first clock signal;

generating a delayed read data signal (DRD) from serial data pulses;

combining said DRD signal and said first clock signal in a data synchronizer;

generating a first edge of said decode window from said DRD signal and said first clock signal and generating a second edge of said decode window directly from said first clock signal.

15. The method of claim 14 further including the step of providing window shifting means for shifting a nominal center of said first clock signal.

16. The method of claim 15 wherein said shifting means is coupled to said VCO and outputs first and second control signals for controlling said nominal center position of said first clock signal.

17. A circuit for providing a programmable decode window generator comprising:

a voltage control oscillator (VCO) for generating a first clock signal having a period and having a first transition point in said period of said first clock signal;

data synchronizing means coupled to a delayed read data (DRD) signal and said first clock signal, said DRD having a mean center position, said data synchronizing means for locking said DRD signal to said first clock signal, said data synchronizing means comprising first and second flip-flops wherein the output of said second flip-flop is coupled in a feedback loop to the reset input of said first flip-flop;

programming means couple to said clock generating means for shifting said first transition point to coincide with said mean center position, said programming means comprising first and second control signals coupled to said VCO, said first and second control signals for controlling the position of said first transition point without altering said period of said first clock signal.

18. A circuit for providing a decode window comprising:

clock generating means for generating a first clock signal having rising and falling edges, said first clock signal having a period defined by consecutive falling edges, said clock generating means comprising a voltage control oscillator (VCO);

data synchronizing means coupled to said first clock signal and to a delayed read data (DRD) signal, said data synchronizing means for detecting a rising edge of said DRD signal and each of said falling edges of first clock signal, said data synchronizing means outputting said decode window wherein said decode window has a rising edge locked to said falling edge of said first clock signal, said data synchronizing means comprising first and second flip-flops, said second flip-flop having a output coupled to a reset of said first flip-flop;

window shifting means coupled to said first clock generating means for shifting said rising edge of said first clock signal, said window shifting means comprising first and second control signals coupled to said VCO for shifting said rising edge of said first clock signal.

19. A method of providing an accurate decode window comprising the steps of:
- providing a voltage control oscillator (VCO) outputting a first clock signal;
- generating a delayed read data signal (DRD) from serial data pulses;
- combining said DRD signal and said first clock signal in a data synchronizer;
- generating a first edge of said decode window from said DRD signal and said said first clock signal;
- generating a second edge of said decode window directly from said first clock signal;
- providing window shifting means for shifting a nominal center of said first clock signal, said window shifting means coupled to said VCO and outputting first and second control signals for controlling said nominal center position of said first clock signal.

* * * * *